United States Patent
MacDowell et al.

(10) Patent No.: US 6,664,023 B2
(45) Date of Patent: Dec. 16, 2003

(54) CONTROLLED AGING OF PHOTORESISTS FOR FASTER PHOTOSPEED

(75) Inventors: Laird MacDowell, Jeffersonville, VT (US); Erik Puttlitz, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 93 days.

(21) Appl. No.: 09/805,753

(22) Filed: Mar. 13, 2001

(65) Prior Publication Data

US 2002/0164539 A1 Nov. 7, 2002

(51) Int. Cl.$^7$ .............................................. G03F 7/004
(52) U.S. Cl. ................. 430/270.1; 430/269; 430/280.1; 430/326; 430/327
(58) Field of Search ............................ 430/269, 270.1, 430/280.1, 326, 327

(56) References Cited

U.S. PATENT DOCUMENTS

| | | | | |
|---|---|---|---|---|
| 4,631,247 A | * | 12/1986 | Tise | 430/281 |
| 5,114,826 A | * | 5/1992 | Kwong et al. | 430/192 |
| 5,631,120 A | | 5/1997 | Swirbel et al. | |
| 5,650,261 A | * | 7/1997 | Winkle | 430/270.1 |
| 5,688,893 A | * | 11/1997 | Rahman et al. | 528/146 |
| 5,712,078 A | * | 1/1998 | Huang et al. | 430/270.1 |
| 5,994,036 A | | 11/1999 | Itoh | |
| 6,087,071 A | | 7/2000 | Komori | |
| 6,303,270 B1 | * | 10/2001 | Flaim et al. | 430/284.1 |

* cited by examiner

*Primary Examiner*—Janet Baxter
*Assistant Examiner*—Amanda C. Walke
(74) *Attorney, Agent, or Firm*—Scully, Scott, Murphy & Presser; William D. Sabo

(57) ABSTRACT

A method for the controlled aging of a photoresist which provides an aged photoresist that has a targeted photospeed which is faster than a conventional unaged photoresist is provided. Specifically, the inventive method includes the step of aging a solution containing at least a photoresist resin composition at a temperature below the thermal decomposition of the photoresist resin composition, but not below 20° C., for a time period that is effective in achieving a targeted photospeed which is faster than a photospeed of an unaged photoresist.

15 Claims, No Drawings

CONTROLLED AGING OF PHOTORESISTS FOR FASTER PHOTOSPEED

DESCRIPTION

1. Field of the Invention

The present invention relates to the field of photolithography, and more particularly to a method for the controlled aging of a photoresist such as a mid-ultraviolet (mid-UV) or deep-ultraviolet (DUV) photoresist so as to obtain an aged photoresist that has faster photospeeds. Faster photospeeds are important in the field of the photolithography since they require lower radiation doses to pattern the photoresist. Lower doses, in turn, equate to decreased processing cost.

2. Background of the Invention

Photoresists such as mid-UV and DUV are typically employed in the semiconductor industry to provide a desired pattern to a surface of a substrate needing patterning. The patterning of the substrate is achieved by applying a photoresist to a surface of a substrate, patterning the photoresist by exposing the same to a defined dosage of radiation, developing the patterned photoresist and transferring the pattern from the photoresist to the substrate via an etching process such as reactive-ion etching. As known to those skilled in the art, the development step includes the use of an appropriate developer solution that is used to selectively remove the photoresist in either the exposed regions (positive-tone photoresists) or, in the unexposed regions (negative-tone photoresists). The steps of applying a photoresist, patterning the photoresist and developing the pattern are referred to in the art as photolithography or simply as lithography.

A common problem with prior art photoresists especially mid-UV and DUV photoresists is that prior art photoresists suffer from variation in photospeeds. That is, a first photoresist may have a different photospeed compared to a second photoresist, despite the two photoresists having the same composition and being made from the same manufacturer. This variation in photospeeds is problematic to a photolithographer since it requires adjustment in the radiation dose used during the photolithographic process and requires rework of the entire photo-tooling process.

The adjusted radiation dose and rework of the photo-tooling process needed to overcome the above-mentioned problem with prior art photoresists adds additional time and cost to the overall photolithography process. This additional cost, in turn, is passed along to the consumer when purchasing a device made from prior art photolithography processing.

In view of the state of prior art photoresists, there is a continued need for developing a new and improved method wherein the variation in photospeeds between a given lot of photoresists is substantially eliminated. Moreover, a method is needed in which a given lot of photoresists have been properly aged to achieve a targeted photospeed that does not vary from run to run.

SUMMARY OF THE INVENTION

The present invention provides a method for the controlled aging of a photoresist such as a mid-UV and DUV photoresist so as to provide an aged photoresist that has a desired targeted photospeed that does not vary from run to run. Specifically, the inventive method comprises the step of:

aging a solution containing at least a photoresist resin composition at a temperature below the thermal decomposition of said photoresist resin composition, but not below 20° C., for a time period that is effective in achieving a targeted photospeed that is above the photospeed of an unaged photoresist.

In accordance with the present invention, the aging step may be conducted in air, in an inert gas ambient such as $N_2$, He, or Ar, or under a vacuum. Moreover, the photoresist resin composition employed in the present invention preferably includes any mid-UV or deep UV, positive-tone or negative-tone photoresist. The term "mid-UV" as used herein denotes a photoresist that may be activated by irradiating the same with UV radiation having a wavelength of about 365 nm, whereas the term "DUV" denotes a photoresist that may be activated by irradiating the same with UV radiation having a wavelength of about 248 nm. Although mid-UV and DUV photoresists are preferred in the present invention, the inventive aging method works with all other photoresists such as, for example, 157 nm photoresists, 193 nm photoresists, e-beam photoresists and G-line photoresists. The term "positive-tone" photoresist denotes a photoresist whose exposed regions are removed, i.e., developed, using an appropriate developer solution, whereas the term "negative-tone" photoresist denotes a photoresist whose unexposed regions are removed, i.e., developed using an appropriate developer solution.

The inventive method provides an aged photoresist having a faster photospeed than heretofore possible with unaged photoresist. Moreover, the entire lot of aged photoresist would have substantially the same photospeed thereby eliminating the variation problem that is typically observed with prior art photoresists.

DETAILED DESCRIPTION OF THE INVENTION

The present invention is directed to a method for the controlled aging of a photoresist which provides an aged photoresist that has a targeted photospeed which is faster than a conventional unaged photoresist. Specifically, the inventive method includes the step of aging a solution containing at least a photoresist resin composition at a temperature below the thermal decomposition of said photoresist resin composition, but not below 20° C., for a time period that is effective in achieving a targeted photospeed which is faster than a photospeed of an unaged photoresist.

The solution containing at least the photoresist composition is made using techniques well known to those skilled in the art, including, but not limited to: adding a desired photoresist resin composition to a solvent which is capable of dissolving the photoresist resin composition and blending the solution for a time period to ensure that the photoresist resin composition is substantially dissolved in the solvent.

The terms "photoresist resin composition or photoresist" are used herein to denote any photoresist such as a mid-UV or DUV polymer resin material that can be activated when exposed to UV radiation. As stated above, the term "mid-UV" denotes a photoresist that may be activated by irradiating the same with UV radiation having a wavelength of about 365 nm, whereas the term "DUV" denotes a photoresist that may be activated by irradiating the same with UV radiation having a wavelength of about 248 nm.

Such polymer resin materials, which typically include an aqueous base soluble polymer or polymers, are well known to those skilled in the art therefore a detailed description concerning the same is not provided herein. An illustrative example includes, but is not limited to: hydroxystyrene polymer having its polar functional groups protected with a high activation energy protecting group (such as a cyclic or branched aliphatic carbonyl, ester or ether containing from about 3 to about 30 carbon atoms), a low activation protecting group (such as a cyclic acetal, aliphatic or cyclic ketal or silylether) or a combination thereof.

It is noted that the polymer resin material mentioned above is exemplary and by no ways limits the scope of the present invention. Instead, the inventive method works with all conventional positive-tone and negative-tone photoresists that are presently available.

The solvents used in forming the solution containing at least the photoresist resin composition are well known solvents that are employed in the art to dissolve the photoresist resin composition. Illustrative examples of solvents that may be employed in the present invention, include, but are not limited to: ethers, glycol ethers, aromatic hydrocarbons, ketones, esters and other like solvents.

In addition to a solvent and the photoresist resin composition, the solution may further contain conventional photoacid generators, photosensitizers, bases, surfactants and combinations thereof. Each of these components is optional and is composed of materials that are well known to those skilled in the art.

Illustrative examples of photoacid generators include, but are not limited to: nitrobenzyl compounds, onium salts, sulfonates, carboxylates and other like acids which generate an acid upon exposure to energy.

Illustrative examples of photosensitizers include, but are not limited to: 9-anthracene methanol, coumarins, 9,10-bis (trimethyoxysilyl ethynyl) anthracene and polymers containing these chromophores.

The bases which may optionally be present include, but are not limited to: berberine, cetyltrimethylammonium hydroxide, 1,8-bis(dimethylamino)naphthalene, tetrabutylammonium hydroxide, amines, polymeric amines and the like.

Insofar as the optional surfactants are concerned, illustrative examples include, but are not limited to: fluorine-containing surfactants such as 3M's FC-430 and siloxane-containing surfactants such as Union Carbide's SILWET series and the like.

It is again emphasized that the inventive method is not limited to the materials mentioned above. Instead, the above materials are given for illustration. Instead, the inventive method works with the above materials as well as with any other conventional photoresist.

Notwithstanding the type of photoresist employed in the present invention, the photoresist is subjected to the inventive aging step. Specifically, the inventive aging step is carried out at a temperature below the thermal decomposition of the solution containing at least the photoresist resin composition, but not below 20° C., for a time period that is effective in achieving a targeted photospeed which is faster than a photospeed of an unaged photoresist. More preferable, the inventive aging step is carried out at temperature of from about 25° C. to about 30° C. for a time period of from about 1 to about 30 days. Most preferably, the inventive aging step is carried out at about 30° C. for a time period of about 5 days.

When a slightly elevated temperature is required for aging, the solution containing the photoresist resin composition may be heated by using a heater which is in thermal contact with the vessel housing the solution. To ensure thorough heating throughout the entire solution, the solution containing the photoresist resin composition should be continuously stirred during the duration of the aging process.

In accordance with the present invention, the aging step may be carried out in air, in an inert gas atmosphere such as $N_2$, Ar or He, or under a vacuum. Preferably the aging step is carried out in air.

Following the desired aging period, the aged solution may then be packaged using conventional means well known to those skilled in the art and shipped to a consumer for use, or the aged solution can be used as is. The aged solution containing the photoresist resin composition is then applied to a surface of a suitable substrate such as a semiconductor chip or wafer using conventional deposition processes well known in the art. For example, the aged solution containing at least the photoresist resin composition is applied to a surface of a substrate by spin-coating, brushing, spraying, dip coating, chemical vapor deposition (CVD) plasma-enhanced CVD, evaporation, chemical solution deposition or sputtering.

The deposited solution containing the photoresist resin composition may then be subjected to a conventional baking process which is carried out a temperature that is sufficient to remove any residual solvent forming a photoresist film on the substrate. The exact conditions for this pre-baking step may vary depending on the type of photoresist resin composition employed. The baked photoresist film is then subjected to an exposure step which forms a pattern in the photoresist film that is developed using a conventional developer which removes either the exposed or unexposed portions of the photoresist film. Since the exposure step and the development step are conventional and well known, a detailed description concerning the same is not needed herein.

Following development of the photoresist film, the pattern provided in the photoresist film is then transferred to the underlying substrate by using a suitable etching process including, but not limited to: reactive-ion etching, ion beam etching, plasma-etching or laser etching.

Unique features of the inventive method include the following:

(i) The inventive aged photoresist films have faster photospeeds (hence lower doses) than conventional unaged photoresist films.

(ii) Because a lot of a specific solution containing the photoresist resin composition is aged under the same conditions, the resultant aged photoresist films from the lot have substantially the same photospeed with little or no variation thereof.

(iii) No loss in photolithographic performance is observed using the inventive aged photoresist films.

(iv) Decreased processing cost can be achieved using the inventive method since there is no reworking required.

The following example is given to illustrate the inventive aging method and some advantages that are obtained therefrom.

EXAMPLE

Aging of DUV Photoresists

In this example, the inventive method was used to age a series of commercially available DUV photoresists. The DUV photoresists used in this study include UV82, UV86, UV111 and UV113 which were prepared, packaged and sold by Shipley and M20G sold and packaged by JSR. It is noted that all these photoresists include polyhydroxystyrene and non-acetal chemistry. Aging in air was carried out at room temperature, i.e., 25° C., and 30° C. for each of the above-mentioned DUV photoresists and at different time intervals (12 days, 28 days, 64 days, 120 days and 177 days). The stability for each sample was determined by measuring delta $E_o$ (photospeed) and is reported in Tables 1 and 2 below. A negative result means a faster photospeed.

TABLE 1

Aging Study @ 25° C.

| Aged time (days) | 12 | 28 | 64 | 120 | 177 |
|---|---|---|---|---|---|
| UV82 | 0.0% | −0.5% | −6.3% | −5.53% | −6.12% |
| UV86 | 0.0% | −0.5% | 0.0% | −4.91% | 3.82% |
| UV110 | 0.0% | 0.0% | −2.2% | −5.39% | −6.21% |
| UV113 | −0.9% | −4.7% | −5.6% | −8.78% | −8.67% |
| M20G | 0.8% | 7.5% | −10.6% | −2.39% | −4.16% |

TABLE 2

Aging Study @ 30° C.

| Aged time (days) | 12 | 28 | 64 | 120 | 177 |
|---|---|---|---|---|---|
| UV82 | 0.0% | −5.6% | −13.1% | −17.51% | −17.01% |
| UV86 | 0.0% | −4.6% | −5.8% | −8.79% | −8.65% |
| UV110 | 2.1% | −1.3% | −11.6% | −16.85% | −18.16% |
| UV113 | 0.0% | −5.6% | −16.2% | −21.43% | −25.00% |
| M20G | 0.0% | 6.3% | −15.4% | −12.19% | −11.79% |

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to exact forms and details described and illustrated, but fall within the scope of the appended claims.

Having thus described our invention in detail, what we claim as new and desire to secure by the Letters Patent is:

1. A method for the controlled aging of a photoresist to a targeted photospeed, said method comprising the step of:

aging a solution containing at least a photoresist resin composition at a temperature below the thermal decomposition of said photoresist resin composition, but not below 20° C., for a time period that is effective in achieving a targeted photospeed that is above the photospeed of an unaged photoresist; and wherein said aging is carried out at a temperature of from about 25° C. to about 30° C. for a time period of from about 1 to about 30 days; and wherein said solution further comprises a photoacid generator, a photosensitizer, a base, and a surfactant.

2. The method of claim 1 wherein said aging is carried out at temperature of about 30° C. for a time period of about 5 days.

3. The method of claim 1 wherein said aging is carried out in air, an inert gas ambient or in a vacuum.

4. The method of claim 3 wherein said inert gas ambient includes Ar, He or $N_2$.

5. The method of claim 1 wherein said aging is carried out in air.

6. The method of claim 1 wherein said aging is carried out with a heater.

7. The method of claim 1 wherein said solution includes a solvent that substantially dissolves said photoresist resin composition.

8. The method of claim 7 wherein said solvent includes ethers, glycol ethers, aromatic hydrocarbons, ketones or esters.

9. The method of claim 1 wherein said photoresist resin composition is a mid-UV photoresist.

10. The method of claim 1 wherein said photoresist resin composition is a DUV photoresist.

11. The method of claim 1 wherein said pohtoresist resin composition is a positive-tone photoresist.

12. The method of claim 1 wherein said photoresist resin composition is a negative-tone photoresist.

13. The method of claim 1 further comprising packaging said aged solution.

14. The meted of claim 1 further comprising applying said aged solution of said photoresist composition to a surface of a substrate; exposing said applied aged solution of said photoresist resin composition to a pattern of radiation, developing the patterned photoresist resin composition and transferring the pattern to said substrate by etching.

15. The method of claim 14 further comprising a baking step prior to exposing said aged solution of said photoresist resin composition.

* * * * *